(12) United States Patent
Demizu et al.

(10) Patent No.: US 7,533,001 B2
(45) Date of Patent: May 12, 2009

(54) APPARATUS AND METHOD FOR EVALUATING EQUIPMENT OPERABILITY

(75) Inventors: Koji Demizu, Kawasaki (JP); Naoyuki Nozaki, Kawasaki (JP); Masayuki Kidera, Kawasaki (JP); Wataru Nishiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 157 days.

(21) Appl. No.: 11/510,655

(22) Filed: Aug. 28, 2006

(65) Prior Publication Data
US 2007/0162237 A1 Jul. 12, 2007

(30) Foreign Application Priority Data
Jan. 6, 2006 (JP) ............................. 2006-001301

(51) Int. Cl.
*G06F 11/30* (2006.01)
*G21C 17/00* (2006.01)
(52) U.S. Cl. .................................................... 702/182
(58) Field of Classification Search ................... 702/22, 702/41, 85; 715/848
See application file for complete search history.

(56) References Cited

U.S. PATENT DOCUMENTS

| 3,973,332 | A | * | 8/1976 | Slomski | 434/258 |
| 4,375,674 | A | * | 3/1983 | Thornton | 702/41 |
| 5,590,268 | A | * | 12/1996 | Doi et al. | 715/848 |
| 6,205,367 | B1 | * | 3/2001 | Arita et al. | 700/98 |
| 7,409,246 | B2 | * | 8/2008 | Demizu et al. | 700/8 |
| 2002/0024517 | A1 | * | 2/2002 | Yamaguchi et al. | 345/424 |
| 2005/0044450 | A1 | * | 2/2005 | Nakata | 714/33 |
| 2007/0162237 | A1 | * | 7/2007 | Demizu et al. | 702/22 |
| 2007/0168144 | A1 | * | 7/2007 | Demizu et al. | 702/85 |

FOREIGN PATENT DOCUMENTS

| JP | 10-240791 | 9/1998 |
| JP | 11-167451 | 6/1999 |

* cited by examiner

*Primary Examiner*—Michael P Nghiem
(74) *Attorney, Agent, or Firm*—Staas & Halsey LLP

(57) ABSTRACT

The equipment operability evaluation apparatus calculates the operating posture of a human body model based on the physique information about a human body model in a physique management table, the operation information in an operation management table, and the target information in a target management table, arranges an equipment model and the human body model taking the calculated operating posture in a three-dimensional virtual space, displays a view image of a three-dimensional virtual space from the point of view of the human body model, and determines the visibility about the target operation area of the equipment model displayed on the view image and the readability of a character string.

7 Claims, 17 Drawing Sheets

FIG. 3

| HUMAN BODY TYPE | HEIGHT | BRACHIUM | FOREARM | ACTIVE | HUMAN BODY TYPE ID |
|---|---|---|---|---|---|
| JAPANESE FEMALE 5% TILE VALUE | 1534.2 | 195 | 143 | | H1 |
| JAPANESE FEMALE 50% TILE VALUE | 1640.2 | 210 | 156 | | H2 |
| JAPANESE MALE 50% TILE VALUE | 1850.0 | 230 | 180 | ✓ | H3 |
| NORTH AMERICAN MALE 99% TILE VALUE | 1950.0 | 260 | 200 | | H4 |
| ⋮ | ⋮ | ⋮ | ⋮ | ⋮ | ⋮ |

FIG. 4

| ITEM | TARGET ID | CONTROL POINT | TARGET PART |
|---|---|---|---|
| 1 | T1 | RIGHT HAND | 100,200,1000 |
| 2 | T2 | LEFT HAND | 200,200,1000 |
| ⋮ | ⋮ | ⋮ | ⋮ |

FIG. 5

| ITEM | VISUAL IDENTIFICATION ID | VISUAL IDENTIFICATION TARGET PART 1 | VISUAL IDENTIFICATION TARGET PART 2 |
|---|---|---|---|
| 1 | S1 | A. part | C. part |
| 2 | S2 | B. part | |
| ⋮ | ⋮ | ⋮ | ⋮ |

FIG. 6

| ITEM | TARGET PART ID | TARGET PART | TARGET ID | RELATIVE POSITION FROM TARGET POSITION |
|---|---|---|---|---|
| 1 | P1 | C. part | T1 | 10,20,30 |
| 2 | P2 | D. part | T1 | 40,60,10 |
| 3 | P3 | E. part | T2 | 50,10,10 |
| ⋮ | ⋮ | ⋮ | ⋮ | ⋮ |

FIG. 7

| ITEM | VISUAL IDENTIFICATION ID | POSITION X, Y | SIZE | CHARACTER STRING LENGTH | ROW SPACING | CHARACTER LINE WIDTH | CHARACTER COLOR RGB | DETERMINATION |
|---|---|---|---|---|---|---|---|---|
| 1 | S1 | 100,20 | 5 | 140 | 4 | 5 | 20,20,40 | OK |
| ... | ... | ... | ... | ... | ... | ... | ... | ... |

| ITEM | ORDER | TARGET ID | VISUAL IDENTIFICATION ID 1 | VISUAL IDENTIFICATION ID 2 | VISUAL IDENTIFICATION ID 3 |
|---|---|---|---|---|---|
| 1 | 1 | T1 | S1 | S2 | |
| 2 | 3 | T2 | S3 | | |
| 3 | 2 | T3 | S4 | S5 | — |
| 4 | 4 | | | | — |
| ⋮ | ⋮ | ⋮ | ⋮ | ⋮ | ⋮ |

FIG. 9

| ITEM | VISUAL IDENTIFI-CATION ID | VISUAL IDENTIFICATION PART COLOR RGB | EXTRACTED BACKGROUND COLOR RGB | BRIGHTNESS DIFFERENCE | COLOR DIFFERENCE | PRESENCE/ ABSENCE OF CHARACTER STRING | DETERMI-NATION |
|---|---|---|---|---|---|---|---|
| 1 | S1 | 100,20,30 | 200,40,0 | NG | NG | PRESENCE | NG |
| 2 | S2 | 255,0,200 | 100,200,0 | OK | OK | ABSENCE | OK |
| ... | ... | ... | ... | ... | ... | ... | ... |

| ITEM | HUMAN BODY TYPE | ORDER | VIEW TARGET | VIEW DETERMINATION RESULT | VISUAL IDENTIFICATION DETERMINATION RESULT | CHARACTER RECOGNITION DETERMINATION RESULT | NEXT OPERATION DETERMINATION RESULT | OPERABILITY DETERMINATION RESULT |
|---|---|---|---|---|---|---|---|---|
| 1 | H1 | 1 | S1 | OK | OK | OK | OK | OK |
|  |  |  | S2 | OK | — | — |  |  |
| 2 |  | 2 | S4 | NG | — | — | OK | NG |
|  |  |  | S5 | OK | — | — | OK |  |
| 3 |  | 3 | S3 | OK | — | — | OK | OK |

APPARATUS AND METHOD FOR EVALUATING EQUIPMENT OPERABILITY

CROSS-REFERENCE TO RELATED APPLICATIONS

This application claims the conventional priority based on Japanese patent application serial No. 2006-001301, filed on Jan. 6, 2006, the disclosures of which are incorporated herein by reference.

BACKGROUND OF THE INVENTION

1. Field of the Invention

The present invention generally relates to an apparatus and method for evaluating equipment operability for evaluating the operability of equipment, and more specifically to an apparatus and method for evaluating equipment operability for evaluating the operability of equipment by determining the visibility and the readability of the target operation area of an equipment model arranged in a three-dimensional virtual space.

2. Description of the Related Art

Conventionally, when an equipment layout is verified, for example, a template is arranged in the target operation area of the equipment, and it is determined whether or not the hand of an operator of the equipment can reach the target operation area, or the target operation area can be within the range of the view of the operator of the equipment. The target operation area of equipment refers to the area on the equipment where a part of the equipment to be operated and a part (for example, a flicker (blinking unit), a label and so on) to be visually identified by the operator during the operation of the equipment are set.

However, in verifying the layout of the equipment by determining whether or not the hand of the operator of the equipment reaches the target operation area, or the target operation area can be within the range of the view of the operator of the equipment, the target operation area can be out of the range of the view because there are practically various physiques. Furthermore, when an operation is actually performed, the hand of an operator can hide the displayed target operation area. Although the view is not interfered with, the hand of the operator can hide the target operation area and the operator cannot confirm the target operation area. Additionally, the visibility and the readability of the target operation area can be varied by the size and the brightness of the displayed target operation area.

Under the circumstances, the layout of equipment is verified using a human body model arranged in a three-dimensional virtual space. That is, the layout of the equipment model displayed on the view image is verified by arranging the human body model of a physique and the equipment model in a three-dimensional virtual space, and displaying a view image as an image viewed in the three-dimensional virtual space from the point of view of the human body model. A human body model is a copy of the shape of a human body. An equipment model is a copy of the shape of equipment.

Furthermore, Japanese Patent Application Laid-open No. 10-240791 describes an equipment operability evaluation support apparatus for supporting the evaluation of the operability of equipment by arranging an equipment model taking the shape of equipment to be designed or equipment to be laid out in a simulation space, arranging a human body model with an operation of the equipment anticipated, and operating the human body model in the simulation space.

Japanese Patent Application Laid-open No. 11-167451 describes a measurement system capable of measuring a difference, a position and so on even under a special condition that can interfere with the recognition of an image by preparing a human body model corresponding to the body type data of a person and data of a posture or operation, and regenerating the posture or operation of the person from the data in a virtual space.

To confirm an object that interferes with the operation of equipment or the view of an operator using a human body model arranged in a three-dimensional virtual space, it is necessary to confirm the object by allowing the human body model to take an operating posture.

Conventionally, to allow the human body model in the three-dimensional virtual space to take an operating posture, for example, the calculation of a posture is performed based on the forward kinematics and a predetermined joint angle, and a view image as an image viewed in the three-dimensional virtual space from the point of view of the human body model taking the calculated posture is displayed. However, in this case, each joint angle is set independently for each physique of a human body model, and the operating posture is calculated. That is, when the physique of a human body model is changed, it is necessary to reset each joint angle of a human body model to regenerate the operating posture. That is because the length of each part of each human body model is different for each physique and the joint angle of the human body model taking an operating posture is changed when the physique is changed. Accordingly, if the posture of the human body model is calculated using the data of the joint angle before changing the physique when the physique of a human body model taking an operating posture is conventionally changed, the range of the view of the human body model is shifted, and it is difficult to verify the layout of the equipment.

For example, assume that a human body model 100 and an equipment model 101 are arranged in a three-dimensional virtual space as shown in FIG. 19A. FIG. 19A shows a card slot 102, a range 200 of the view of the human body model 100, and a point P indicating the target position of the right hand of the human body model 100 to be moved. The card slot 102 is a target operation part of the equipment model 101. The equipment model 101 is, for example, a model of an ATM. The human body model 100 takes a posture for performing an operation of, for example, inserting a card, and the right hand of the human body model 100 is in the position of the point P. The card slot 102 is in the range 200 of the view of the human body model 100. In this state, when the physique of the human body model 100 is changed, the right of the human body model 100 is displaced from the point P as shown in FIG. 19B. Additionally, the card slot 102 is displaced from the range 200 of the view of the human body model.

Furthermore, conventionally there has been the problem that the optimum posture of the human body model for an operation cannot be maintained when the layout of equipment is changed.

Additionally, there has conventionally been a well-known technology of calculating a posture corresponding to an operation by associating the posture of a human body model arranged in a three-dimensional virtual space with the target operation part of target equipment. However, this method can only be used for the target equipment. Therefore, it is difficult to verify a layout when another piece of equipment is used in this method.

Furthermore, there has been a well-known function of displaying a view image of a human body model by allowing the human body model to take an operating posture in a three-dimensional virtual space. However, there is the problem with this function that it cannot be determined on the visibility and the readability of the target operation area of an equipment model displayed on the view image.

Conventionally, there also has been the problem that the visibility or the readability for the target operation area of an equipment model in a series of operations required to attain an operation purpose of equipment cannot be determined. For example, as shown in FIG. 20A, the human body model 100 is allowed to take an operating posture of inserting a card into the card slot 102 of the equipment model 101, and then to automatically take a posture of an operating transaction selection part 105 of the equipment model 101 as shown in FIG. 20B. It is hard to determine the visibility and the readability on the target operation area of the equipment model in these series of operations performed by the human body model 100 based on the above-mentioned process.

SUMMARY OF THE INVENTION

It is an object of the present invention to provide an apparatus for evaluating equipment operability which evaluates the operability of equipment from the point of view of the human body model taking a posture adapted to the target position even when the physique of a human body model is changed.

It is another object of the present invention to provide a method for evaluating equipment operability for evaluating the operability of equipment from the point of view of the human body model taking a posture adapted to the target position even when the physique of a human body model is changed.

The apparatus for evaluating equipment operability of the present invention evaluates operability of equipment. The apparatus comprises a physique management unit managing physique information about a human body model as a copy of a shape of a human body, a target management unit managing a human body part of the human body model and a target position to which the human body part is to be moved as target information, a posture calculation unit calculating an operating posture taken when the human body model is operating an equipment model as a copy of a shape of the equipment using the target position as a watch point of the human body model based on the physique information about the human body model managed by the physique management unit and the target information managed by the target management unit, a simulation unit arranging the equipment model and the human body model taking the operating posture calculated by the posture calculation unit in a three-dimensional virtual space, and displaying a view image as an image of the three-dimensional virtual space viewed from the point of view of the human body model taking the operating posture, and a view determination unit determining whether or not a visual identification target part is in the range of the view of the human body model using the information about the visual identification target part as the part of the equipment model to be visually confirmed by the human body model.

Preferably, the apparatus of the present invention further comprises a first determination unit determining visibility of a visual identification target part of the equipment model displayed on the view image and readability of a character string associated with the visual identification target part based on the information about the visual identification target part, and a second determination unit determining the operability of the equipment based on a determination result by the first determination unit.

Preferably, the apparatus of the present invention further comprises an operating posture management unit managing an order in which the human body model takes the operating posture and the target information for use in calculating the operating posture for each operating posture taken by the human body model. The posture calculation unit calculates the operating posture of the human body model in the order in which the human body model takes the operating posture managed by the operating posture management unit.

The method for evaluating equipment operability of the present invention evaluates operability of equipment using an equipment operability evaluation apparatus. The method comprises managing physique information about a human body model as a copy of a shape of a human body, managing a human body part of the human body model and a target position to which the human body part is to be moved as target information, calculating an operating posture taken when the human body model is operating an equipment model as a copy of the shape of the equipment using the target position as a watch point of the human body model based on the physique information about the human body model and the target information, arranging the equipment model and the human body model taking the calculated operating posture in a three-dimensional virtual space, and displaying a view image as an image of the three-dimensional virtual space viewed from a point of view of the human body model taking the operating posture, and determining whether or not a visual identification target part is in a range of view of the human body model using information about the visual identification target part as a part of the equipment model to be visually confirmed by the human body model.

The apparatus and method for evaluating equipment operability evaluation apparatus according to the present invention calculate the operating posture as a posture taken when a human body model operates an equipment model as a copy of the shape of equipment using a target position as a watch point of the human body model based on the physique information about the human body model and the target position to which a human body part is to be moved, then arrange the equipment model and the human body model taking the calculated operating posture in the three-dimensional virtual space, display a view image as an image of the three-dimensional virtual space viewed from the point of view of the human body model, and determine whether or not the visual identification target part as a part of the equipment model to be visually confirmed by the human body model are in the range of the view of the human body model. Thus, when the physique of the human body model is changed, the human body model is correspondingly and automatically allowed to take the operating posture adapted to the target position, and it can be determined whether or not the visual identification target part is in the range of the view of the human body model.

Thus, the visibility and the readability of the target operation area of the equipment model displayed on the view image can be determined. Additionally, the operating posture can be calculated without setting each joint angle independently for each physique of the human body model. Therefore, the operating posture can be changed without displacing the range of the view of the human body model when the physique of the human body model taking a certain operating posture is changed, and the layout of equipment can be verified. Furthermore, the visibility and the readability on the target operation area of the equipment model in a series of operations of the equipment can be determined. That is, by allowing the human body model to take a certain operating posture, automatically allowing it to take the next operating posture, and based on the processes, the visibility and the readability of the target operation area of the equipment model in a series of operations can be determined.

As described above, according to the present invention, an object interfering with the operation of equipment and the view can be confirmed by using a human body model arranged in the three-dimensional virtual space and allowing the human body model to take an operating posture. Therefore, according to the present invention, although the physique of a human body model is changed, the human body model can be automatically allowed to take an operating posture adapted to a target position, and the visibility and the readability on the visual identification target part on the equipment model viewed from the point of view of the human body model can be determined. Furthermore, when the layout of equipment is changed, the optimum posture of a human body model for an operation can be maintained, and the layout can be verified on various types of equipment.

The apparatus for evaluating equipment operability according to the present invention can also be configured to manage the information about the target part to be operated by a human body model as associated with the target position, keep the relative position to the target position associated with the target part constant, and calculate the operating posture as a posture taken when the human body model operates the equipment model using the target position as a watch point of the human body model based on the physique information about the human body model, the target information, and the target part information. According to the present invention having the above-mentioned configuration, when the position of the target part is moved, the target position is changed such that the relative position to the target part can be kept constant. Therefore, although the layout of equipment is changed and the position of the target part has been moved, the human body model can be allowed to automatically take an operating posture adapted to the change of the layout of the equipment.

Additionally, the apparatus for evaluating equipment operability according to the present invention manages the order in which the human body model takes an operating posture and the target information used in calculating an operating posture for each operating posture taken by the human body model, and calculates the operating posture of the human body model in the managed order in which the human body model takes an operating posture. Therefore, according to the present invention, the visibility and the readability on the visual identification target part of an equipment model in a series of operations required to attain the operation purpose of equipment can be determined.

BRIEF DESCRIPTION OF THE DRAWINGS

FIG. 3 shows an example of a data structure of a physique management table.

FIG. 4 shows an example of a data structure of a target management table.

FIG. 5 shows an example of a data structure of a visual identification management table.

FIG. 6 shows an example of a data structure of a target part management table.

FIG. 7 shows an example of a data structure of a character string setting table.

FIG. 8 shows an example of a data structure of an operation management table.

FIG. 9 shows an example of a data structure of a visual identification determination management table.

FIG. 10 shows an example of a data structure of an operation determination table.

DETAILED DESCRIPTION OF THE PREFERRED EMBODIMENTS

Figure 1:
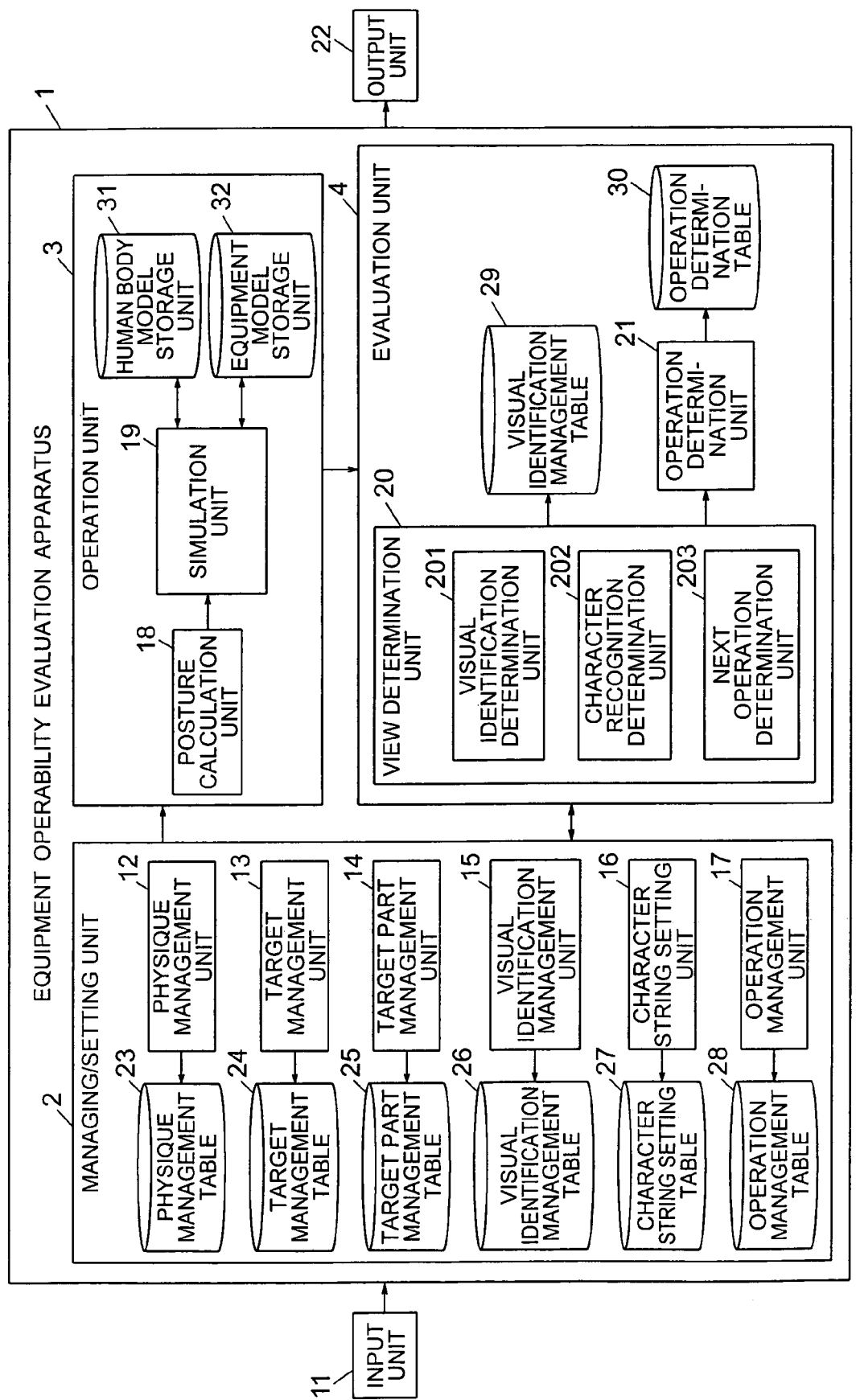
FIG. 1 shows an example of a structure of an equipment operability evaluation apparatus according to the present invention.

FIG. 1 shows an example of the structure of the apparatus for evaluating equipment operability according to the present invention. An equipment operability evaluation apparatus 1 shown in FIG. 1 is a processing device for evaluating the operability of equipment by determining the visibility and the readability of a target operation area of an equipment model in the view of a human body model arranged in a three-dimensional virtual space.

The equipment operability evaluation apparatus 1 includes an input unit 11, a managing/setting unit 2, an operation unit 3, an evaluation unit 4, and an output unit 22. The input unit 11 inputs instruction information for the equipment operability evaluation apparatus 1 according to the specification input of the user of the equipment operability evaluation apparatus 1. The input unit 11 inputs as the instruction information, for example, the necessary information for the evaluation of the operability of equipment managed by the managing/setting unit 2. The managing/setting unit 2 sets and manages the necessary information for the evaluation of the operability of equipment. The managing/setting unit 2 includes a physique management unit 12, a target management unit 13, a target part management unit 14, a visual identification management unit 15, a character string setting unit 16, and an operation management unit 17. The operation unit 3 calculates the operating posture of a human body model, arranges an equipment model and the human body model having the calculated operating posture in a three-dimensional virtual space, and displays a view image as an image of the three-dimensional virtual space viewed from the point of view of the human body model. The operation unit 3 includes a posture calculation unit 18 described later, and a simulation unit 19. The evaluation unit 4 evaluates the operability of equipment. The evaluation unit 4 includes a view determination unit 20 and an operation determination unit 21 described later. An output unit 22 outputs an evaluation result of the operability of equipment. The output unit 22 outputs, for example, the recorded contents in an operation determination table 30 as an evaluation result of the operability of equipment.

The physique management unit 12 includes a physique management table 23, and manages the physique information about the human body model arranged in the three-dimensional virtual space. The managed physique information is stored in the physique management table 23.

The target management unit 13 includes a target management table 24, and manages target information. The managed target information is stored in the target management table 24. The target management unit 13 manages as target information, for example, the control point of the human body model in the three-dimensional virtual space and a target position to which the control point is to be moved. The control point corresponds to, for example, a human body part such as a right hand, a left hand and so on. The target position is an operation position on an equipment model.

The target part management unit 14 includes a target part management table 25, and manages target part information. The managed target part information is stored in the target part management table 25. The target part management unit 14 manages as target part information, for example, a target part and a relative position of the target part to the target position. The target part is a part to be operated in the parts of equipment. Therefore, a target part is normally arranged close to a target position. A target part can be, for example, a card slot and so on.

The visual identification management unit 15 includes a visual identification management table 26, and manages visual identification information. Visual identification information is information about a part to be visually confirmed by a human body model among the parts of an equipment model. The managed visual identification information is stored in the visual identification management table 26. The visual identification management unit 15 manages as the visual identification information, for example, the information about a visual identification target part to be visually confirmed by a human body model among the parts of an equipment model. That is, the visual identification management unit 15 is a visual identification management unit managing as visual identification information the information about a visual identification target part of an equipment model to be visually confirmed by a human body model. A visual identification target part can be, for example, a flicker, a label and so on.

The character string setting unit 16 sets (stores) the attribute information about a character string associated with each visual identification target part in a character string setting table 27. A character string associated with a visual identification target part corresponds to, for example, a character string displayed on or applied to a visual identification target part, a character string displayed on or applied to an area around the visual identification target part and so on. The attribute information about the set character string can be, for example, the position, size, color, and character width and so on of a character string displayed on a visual identification target part.

The operation management unit 17 includes an operation management table 28, and manages operation information. The managed operation information is stored in the operation management table 28. The operation information is information about a series of operations required to attain the purpose of an operation. The operation information includes, for example, an order of operating postures in which a human body model takes each operating posture and target information. That is, the operation management unit 17 is an operating posture management unit managing as operation information an order of operating postures in which a human body model takes each operating posture and target part information for use in calculation of operating posture for each operating posture taken by the human body model. The operation management unit 17 can also be configured to manage as operation information an order of operating postures in which a human body model takes each operating posture and target part information for each operating posture taken by the human body model.

The operation management unit 17 can further be configured to manage as operation information an order of operating postures in which a human body model takes each operating posture, target information or target part information, and visual identification information for each operating posture taken by the human body model. In this case, the visual identification information corresponding to the operating posture can be the information about a visual identification target part to be watched by a human body model or a visual identification target part to be visually confirmed by the human body model that is used when the posture calculation unit 18 described later calculates a posture of the human body model. The visual identification information corresponding to an operating posture can be the information about a visual identification target part to be processed in the view determining process, the visual identification determining process, and the character recognizing process performed by the view determination unit 20.

The posture calculation unit 18 calculates a posture to be taken by a human body model in a three-dimensional virtual space. For example, the posture calculation unit 18 calculates the posture of the human body model for allowing the control point of the human body model having the physique corresponding to the physique information to move to a target position and for allowing the human body model to watch the target position based on the physique information of the human body model in the physique management table 23, the operation information in the operation management table 28, and the target information in the target management table 24.

A target to be watched by a human body model can be a visual identification target part. For example, the posture calculation unit 18 can also calculate the posture of the human body model for allowing the control point of the human body model having the physique corresponding to the physique information to move to a target position and for allowing the human body model to watch the target position and visually confirm a visual identification target part based on the physique information of the human body model in the physique management table 23, the operation information in the operation management table 28, the target information in the target management table 24, and the visual identification information in the visual identification management table 26.

Furthermore, for example, the posture calculation unit 18 can also calculate the posture of the human body model for allowing the control point of the human body model having the physique corresponding to the physique information to move to a target position at a predetermined relative position from a target part and for allowing the human body model to watch the target position based on the physique information of the human body model in the physique management table 23, the operation information in the operation management table 28, the target part information in the target part management table 25, and the target information in the target management table 24.

The target to be watched by a human body model can be a visual identification target part. For example, the posture calculation unit 18 can also calculate the posture of the human body model for allowing the control point of the human body model having the physique corresponding to the physique information to move to a target position at a predetermined relative position from a target part and for allowing the human body model to watch the target position and visually confirm a visual identification target part based on the physique information of the human body model in the physique management table 23, the operation information in the operation management table 28, the target information in the target management table 24, and the visual identification information in the visual identification management table 26.

For example, when the position of a target part to be operated is changed, the posture calculation unit 18 changes the target position used in calculating a posture such that the relative position to the target part can be in a predetermined range, and calculates the posture for allowing the control point of a human body model to move to the changed target position. As the posture calculation unit 18 calculates the posture of the human body model based on the target part information, the optimum posture of a human body model can be maintained for an operation although the layout of equipment has been changed.

The posture calculation unit 18 outputs, for example, the angles of the joints at the neck, the shoulder, the elbow, and the wrist, and the position of the eyes of a human body model as posture information. Practically, the posture calculation unit 18 performs the calculation of the posture in the process using the well-known inverse kinematics (IK). The inverse kinematics generally refers to the function of setting a hierarchical structure of a parent, a child, a grandchild and so on for an object such that upper child and parent objects are moved when the grandchild object are firstly moved. The process used by the posture calculation unit 18 in calculating the posture according to the present invention is not limited to the inverse kinematics. For example, the posture calculation unit 18 can calculate the posture using the process of the well-known dynamics and so on.

The simulation unit 19 arranges the human body model having the operation posture calculated by the posture calculation unit 18 together with the equipment model in the three-dimensional virtual space. The simulation unit 19 displays a view image as an image of the three-dimensional space viewed from the point of view of the human body model as described later by referring to FIG. 15. For example, the simulation unit 19 generates an image of an equipment model when a predetermined light source emits light in a well-known process such as, for example, a radio city method and so on to the equipment model arranged in the three-dimensional virtual space as described later.

The simulation unit 19 includes a human body model storage unit 31 and an equipment model storage unit 32. The human body model storage unit 31 stores human body model information. The equipment model storage unit 32 stores equipment model information. The human body model information is the information used in arranging the human body model of a standard (or reference) physique in the three-dimensional virtual space. By reading the human body model information, the simulation unit 19 arranges the human body model of the standard physique in the three-dimensional virtual space. The equipment model information is the information used in arranging the equipment model to be evaluated in the three-dimensional virtual space. By reading the equipment model information, the simulation unit 19 arranges the equipment model in the three-dimensional virtual space.

The view determination unit 20 performs a view determining process for determining whether or not a visual identification target part of the equipment model displayed on the view image is in the range of the view of the human body model, that is, whether or not the human body model can visually confirm the visual identification target part. That is, the view determination unit 20 is a view determination unit determining whether or not a visual identification target part is in the range of the view of the human body model using visual identification management unit managing as visual identification information the information about the visual identification target part as a part of the equipment model to be visually confirmed by the human body model. The view determination unit 20 includes a visual identification determination unit 201, a character recognition determination unit 202, and a next operation determination unit 203, calls them to perform the visual identification determining process, the character recognition determining process, and the next operation determining process described later. That is, the view determination unit 20 is visibility/readability determination unit (a first determination unit) determining the visibility of the visual identification target part of the equipment model displayed on the view image and the readability of the character string associated with the visual identification target part based on the information about the visual identification target part.

The operation determination unit 21 determines the operability of the equipment in a series of operations performed by the human body model based on the determination result performed by the view determination unit 20. That is, the operation determination unit 21 is an operability determination unit (a second determination unit) determining the operability of the equipment based on the determination result by the view determination unit 20. The operation determination unit 21 includes the operation determination table 30, and records the determination result by the view determination unit 20 and the determination result of the operability of the equipment in the operation determination table 30 for each operating posture of the human body model. Therefore, the operation determination table 30 stores the determination result by the operation determination unit 21.

In the view determination unit 20, the visual identification determination unit 201 performs a visual identification determining process for determining whether or not a visual identification target part on the view image can be visually identified (for example, easily seen).

The result of the visual identification determining process by the visual identification determination unit 201 is recorded in the visual identification management table 29 provided for the view determination unit 20. The character recognition determination unit 202 performs a character recognition determining process for determining the readability of a character string displayed on the visual identification target part in the view image. The character recognition determination result is recorded in the character string setting table 27 provided for the character string setting unit 16. The next operation determination unit 203 performs a next operation determining process of determining whether or not the range of the view of the human body model in the view image includes the target position or the target part of the next operation.

The equipment operability evaluation apparatus 1 is formed by a computer, and the function of each component is realized by a CPU and a program executed by the CPU. The program can be stored in a computer-readable recording medium, for example, semiconductor memory, a hard disk, CD-ROM, a DVD and so on, can be recorded in any of these recording media and provided, or provided by the transmission and reception using a network through a communication interface.

Figure 2:
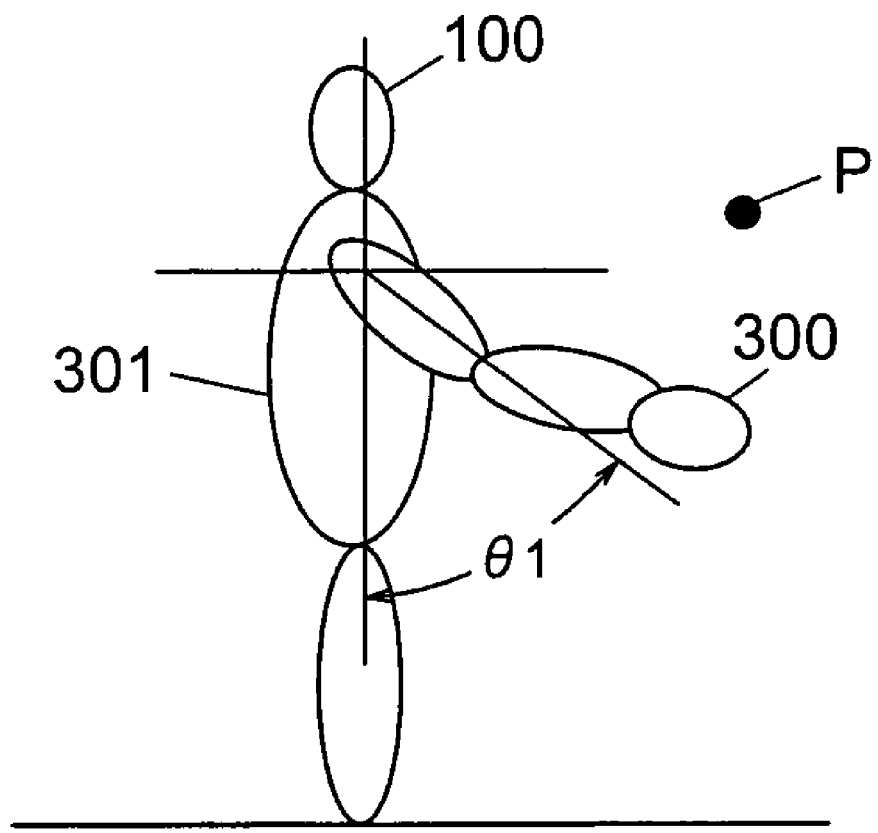
FIG. 2 is an example of an explanatory view of inverse kinematics (IK).

FIG. 2 shows an example of an explanatory view of the inverse kinematics (IK). In FIG. 2, among human body parts of the human body model 100, a portion to be moved to the point P as a target position (hereinafter referred to as an end-effector) 300 corresponds to a control point. Reference numeral 301 designates a fixed portion, and θ1 indicates the angle of the shoulder joint of the human body model 100.

The calculation range of the inverse kinematics is the range from the end-effector 300 to the last fixed portion 301 through each parent link. That is, the inverse kinematics calculates a posture (subsequent posture) from a certain posture (hereinafter referred to as a preceding posture) of the human body model 100, and the calculation result is an angle of each joint of the human body model 100. The calculation of a posture is performed using the position of the fixed point (omitted in the drawings) of the fixed portion 301, the angle of each joint of the shoulder joint, the elbow, the wrist, the position of the end-effector 300, and the preceding posture. When the posture to be calculated is the human body model 100, normally the waist is set as a fixed point because it is positioned at the center of the limbs.

Assume that the human body model 100 takes the posture for allowing the end-effector 300 to move to the point P as a target position. When the size of the human body model 100 is changed, the position of the waist also changes. If the fixed point of the human body model 100 before the change of the size is set to the position of the waist, the position of the end-effector 300 is separated from the point P. Using the inverse kinematics, the posture for allowing the end-effector 300 to move to the point P as a target position can be calculated for any human body type by associating the fixed point with the target position.

FIG. 3 shows an example of a data structure of a physique management table. For each "human body type", the physique management table 23 stores "height", "brachium", "forearm", "active", "human body type ID" and so on as associated with the "human body type".

The "human body type" stores the type of the statistical value (for example, the value of a height, the value of the length of a brachium, the value of the length of a forearm and so on) of each part of a human body stored in the physique management table 23. For example, as shown in FIG. 3, the "human body type" stores a "Japanese female 5% tile value" indicating the 5% tile value of a Japanese female, and a "North American male 99% tile value" indicating the 99% tile value of a North American male. The "height" stores the value of the height corresponding to the human body type stored in the "human body type". The "brachium" stores the value of the length of a brachium corresponding to the human body type stored in the "human body type". The "forearm" stores the value of the length of a forearm corresponding to the human body type stored in the "human body type". The "active" sets a flag indicating which human body type has been selected. For example, when a human body type is selected, a flag indicating that the human body type has been selected is set in the "active" corresponding to the selected human body type is set. In the example in the physique management table 23 shown in FIG. 3, the Japanese male 50% tile value is selected as a human body type. The "human body type ID" stores an identifier uniquely identifying a human body type.

FIG. 4 shows an example of the data structure of a target management table. The target management table 24 stores "item", "control point", "target part" and so on as associated with the "target ID" for each "target ID".

The "target ID" stores an identifier uniquely identifying the target information. The "item" stores a number of each record of the target management table 24. The number of the record is a number of the row in the target management table 24. A record refers to each row (one line) in the target management table 24 (same in other tables). The "control point" stores a name of the control point as a part of a human body model to be moved to a target position. The "target position" stores coordinates of the target position. The coordinates of the stored target position are, for example, the relative coordinates from a reference position of the human body model. In the example of the target management table 24 shown in FIG. 4, for example, the target ID of T1 indicates the target information that the right hand of a human body model is to be moved to the target position of the coordinates (100, 200, 1000).

FIG. 5 shows an example of the data structure of the visual identification management table. The visual identification management table 26 stores an "item", a "visual identification target part 1", a "visual identification target part 2" and so on as associated with the "visual identification ID" for each "visual identification ID". The "visual identification ID" stores an identifier uniquely identifying the visual identification information. The "item" stores a number of each record in the visual identification management table 26. The "visual identification target part 1" and the "visual identification target part 2" store a name of a visual identification target part as a part to be visually confirmed by a human body model.

FIG. 6 shows an example of the data structure of the target part management table. The target part management table 25 stores an "item", a "target part", a "target ID", a "relative position from target position" and so on as associated with a "target part ID" for each "target part ID".

The "target part ID" stores an identifier for uniquely identifying a target part information. The "item" stores a number of each record of the target part management table 25. The "target part" stores a name of a target part. The "target ID" stores a target ID corresponding to the target position to be associated with the target part. The "relative position from target position" stores relative coordinates of the target part stored in the "target part" from the target position corresponding to the target ID stored in the "target ID". By setting the "relative position from target position", the target part stored in the "target part" is associated with the target position indicated by the target ID stored in the "target ID". For example, as indicated by the first record of the target part management table 25 shown in FIG. 6, when the "target part" is C. part, and the "target ID" is T1, "(10, 20, 30)" stored in the "relative position from target position" indicate the relative coordinates of the C. part from the target position "(100, 200, 1000)" corresponding to the target ID of T1 in the target management table 24.

FIG. 7 shows an example of a data structure of the character string setting table. The character string setting table 27 stores the "item", a "position X, Y", a "size", a "character string length", a "row spacing", a "character line width", a "character color RGB", a "determination" and so on as associated with the "visual identification ID" for each "visual identification ID".

The "visual identification ID" stores a visual identification ID corresponding to the visual identification target part on which a character string as a target of a character recognition determination is displayed. The "item" stores a number of each record of the character string setting table 27. The "position X, Y" stores coordinates on the view image of the character string displayed on the visual identification target part corresponding to the "visual identification ID". The "size" stores a size of a character string (for example, a point number and so on). The "character string length" stores a length of a character string. The "row spacing" stores a row spacing of a character string. The "character line width" stores a line width of a character forming the character string. The "character color RGB" stores a color of a character of a character string (for example, an RGB value). The "determination" stores a result of the character recognition determining process by the character recognition determination unit 202 for the character string. An RGB value refers to the value of a gray scale (for example, 0 to 255) of each signal of R (red), G (green), and B (blue) when the color is expressed by the three primary colors (RGB).

FIG. 8 shows an example of a data structure of the operation management table. The operation management table 28 stores the "item", the "target ID", a "visual identification ID 1", a "visual identification ID 2", a "visual identification ID 3" and so on as associated with the "order" for each "order".

Each record of the operation management table 28 corresponds to each operating posture of the human body model performing a series of operations. The "order" stores an order of each operating posture taken by the human body model. The "item" stores a number of each record of the operation management table 28. The "target ID" stores a target ID corresponding to each operating posture. The "visual identification ID 1" to "visual identification ID 3" store the visual identification ID corresponding to each operating posture.

For example, in the first record of the operation management table 28 shown in FIG. 8, T1 is set for the "target ID", S1 is set for the "visual identification ID 1", and S2 is set for the "visual identification ID 2". On the target management table 24 shown in FIG. 4, the control point corresponding to the target ID of T1 refers to the right hand, and the target position is indicated by the coordinates (100, 200, 1000). Referring the visual identification management table 26 shown in FIG. 5, the visual identification target parts corresponding to the visual identification ID of S1 are A. part and C. part, and the visual identification target part corresponding to the visual identification ID of S2 is B. part. Therefore, for example, the first record of the operation management table 28 shown in FIG. 8 corresponds to the operating posture of the human body model moving its right hand and the watch point to the coordinates (100, 200, 1000) and visually confirming the A. part, C. part, and B part.

FIG. 9 shows an example of a data structure of the visual identification determination management table. The visual identification management table 29 stores the "item", the "visual identification part color RGB", the "extracted background color RGB", the "brightness difference", the "color difference", the "presence/absence of character string", the "determination" and so on as associated with the "visual identification ID" for each "visual identification ID".

The "visual identification ID" stores a visual identification ID corresponding to the visual identification target part as an object of the visual identification determining process by the visual identification determination unit 201. The "item" stores a number of each record of the visual identification management table 29. The "visual identification part color RGB" stores color information (for example, an RGB value) about the visual identification target part corresponding to the "visual identification ID". The "extracted background color RGB" stores color information (for example, an RGB value) of the background area in the view image of the visual identification target part corresponding to the "visual identification ID". The "brightness difference" stores information indicating whether or not the brightness difference between the visual identification target part and the background area of the visual identification target part is equal to or exceeds a predetermined threshold. For example, the "brightness difference"-stores information indicating whether or not the brightness difference is equal to or exceeds 125. The "color difference" stores information indicating whether or not the color difference between the visual identification target part and the background area of the visual identification target part is equal to or exceeds a predetermined threshold. For example, the "color difference" stores the information indicating whether or not the color difference is equal to or exceeds 500. The "presence/absence of character string" stores information indicating whether or not a character string is displayed on the visual identification target part corresponding to the "visual identification ID". The "determination" stores a result of the visual identification determining process by the visual identification determination unit 201 for the visual identification target part corresponding to the "visual identification ID".

FIG. 10 shows an example of a data structure of the operation determination table. The operation determination table 30 stores the "item", the "order", the "view target", the "view determination result", the "visual identification determination result", the "character recognition determination result", the "next operation determination result", the "operability determination result" and so on as associated with the "human body type" for each "human body type".

The "item" stores a number of each record of the operation determination table 30. The "human body type" stores a human body type ID corresponding to the human body type of the human body model operating the equipment model. The "order" stores an order in which the human body model takes the operating posture. The "view target" stores a visual identification ID of the visual identification target part as an object of the view determining process, the visual identification determining process, and the character recognition determining process. That is, the "view target" stores a visual identification ID corresponding to the operating posture associated with the order stored in the "order". For example, the "view target" corresponding to the first order stores the visual identification IDs of S1 and S2 stored in the first record of the operation management table 28 shown in FIG. 8. The "view determination result" stores a result of the view determining process by the view determination unit 20. The "visual identification determination result" stores a result of the visual identification determining process by the visual identification determination unit 201. The "character recognition determination result" stores a result of the character recognition determining process by the character recognition determination unit 202. The "next operation determination result" stores a result of the next operation determining process by the next operation determination unit 203 as associated with the "order". The "operability determination result" stores a determination result of the operability of the equipment of the operation determination unit 21 as associated with the "order".

The change in the operating posture of the human body model when the human body type is changed is explained below by referring to FIG. 11.

Figure 11A:
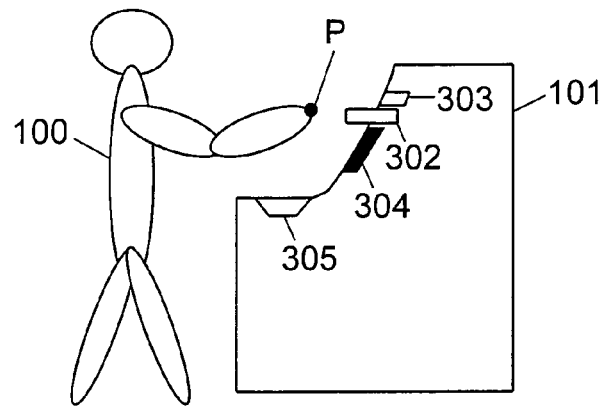
FIGS. 11A and 11B are explanatory diagrams of a change of an operating posture of a human body model when a human body type is changed.
Figure 11B:
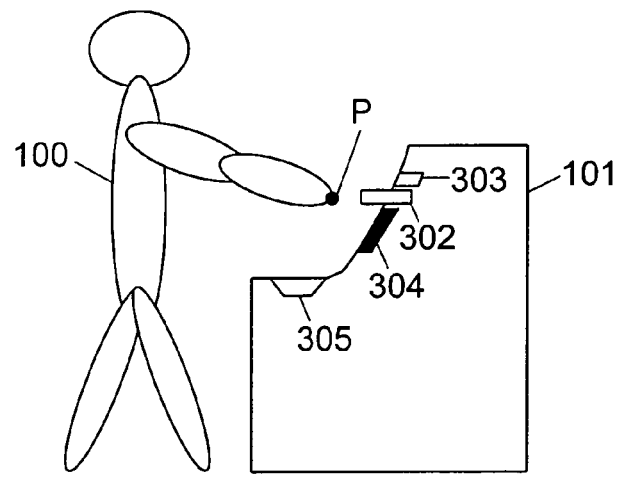

FIG. 11A shows an example of the operating posture taken by the human body model before the change of the human body type. FIG. 11B shows an example of the operating posture taken by the human body model when the human body type is changed. In FIGS. 11A and 11B, the point P denotes the target position of the human body model 100 set in the target management table 24, 302 denotes a target part set in the target part management table 25, and 303 to 305 denote visual identification target parts 303 to 305 are set in the visual identification management table 26. The target part management unit 14 keeps the relative position for the point P as a target position of the target part 302 constant.

For example, the posture calculation unit 18 calculates the posture for allowing the right hand as a control point and the watch point of the human body model 100 to move from the target part 302 to the point P in a predetermined relative position based on the physique information corresponding to the human body type selected from the physique management table 23, the target information set in the target management table 24, and the target part information set in the target part management table 25.

In one embodiment of the present invention, the posture calculation unit 18 can also calculate the posture for allowing the right hand as a control point and the watch point of the human body model 100 to move from the target part 302 to the point P in a predetermined relative position and for allowing the human body model 100 to virtually confirm the visual identification target parts 303 to 305 based on the physique information corresponding to the human body type selected from the physique management table 23, the target information set in the target management table 24, the target part information set in the target part management table 25, and the visual identification information set in the visual identification management table 26. Based on the calculated posture information, the simulation unit 19 allows the human body model 100 to take the posture in the three-dimensional virtual space as shown in FIG. 11A.

When the human body type of the human body model 100 is changed, the simulation unit 19 changes the physique of the human body model 100 based on the physique information corresponding to the changed human body type in the physique management table 23. The posture calculation unit 18 calculates the posture for allowing the right hand as the control point of the human body model 100 having the changed physique to move to the point P. The simulation unit 19 allows the human body model 100 having the changed physique to take the posture shown in FIG. 11B in a three-dimensional virtual space.

Figure 12:
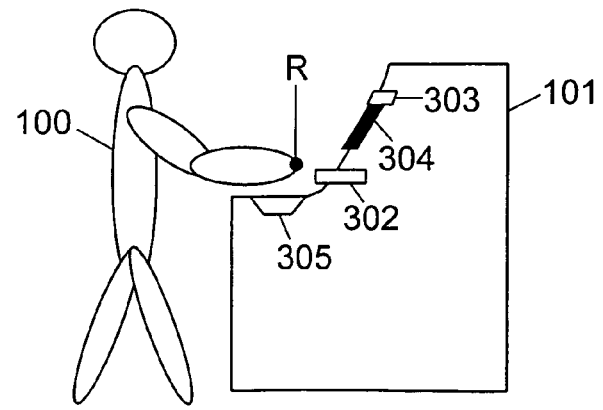
FIG. 12 shows an operating posture of a human body model when the layout of an equipment model is changed.

FIG. 12 shows the operating posture of a human body model when the layout of an equipment model is changed.

For example, assume the case in which the layout of the equipment model 101 shown in FIG. 11A is changed, and the position of the target part 302 as an operation target is moved to the position below the position of the target part 302 shown in FIG. 11A as shown in the layout of the equipment model 101 in FIG. 12.

The posture calculation unit 18 changes the coordinates of the target position associated with the target part 302 so that the relative position to the target position of the target part 302 set in the target part management table 25 can be kept constant. For example, the coordinates of the point P as a target position in FIG. 11A are changed to the coordinates of the point R shown in FIG. 12. The posture calculation unit 18 calculates the posture for allowing the right hand as a control point and the watch point of the human body model 100 to move to the point R at a predetermined relative position from the target part 302 whose position is changed. In one embodiment of the present invention, the posture calculation unit 18 can calculate the posture for allowing the right hand and the watch point of the human body model 100 as a control point to move to the point R at a predetermined relative position from the target part 302 whose position is changed and for allowing the human body model 100 to virtually confirm the visual identification target parts 303 to 305. Based on the calculated posture information, the simulation unit 19 allows the human body model 100 to take the posture shown in FIG. 12 in a three-dimensional virtual space.

Figure 13:
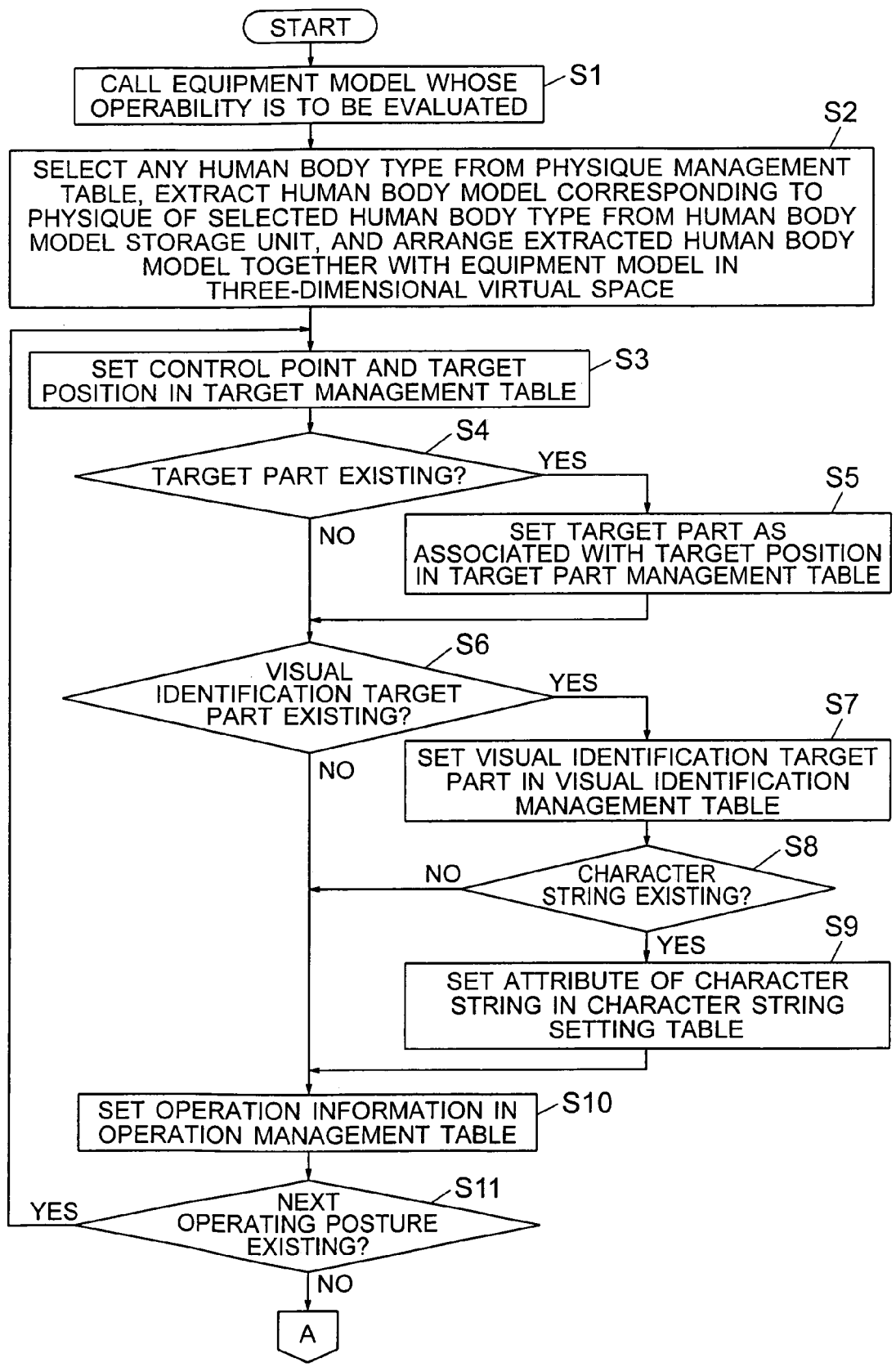
FIGS. 13 and 14 show an example of a flowchart of an equipment operability evaluating process.
Figure 14:
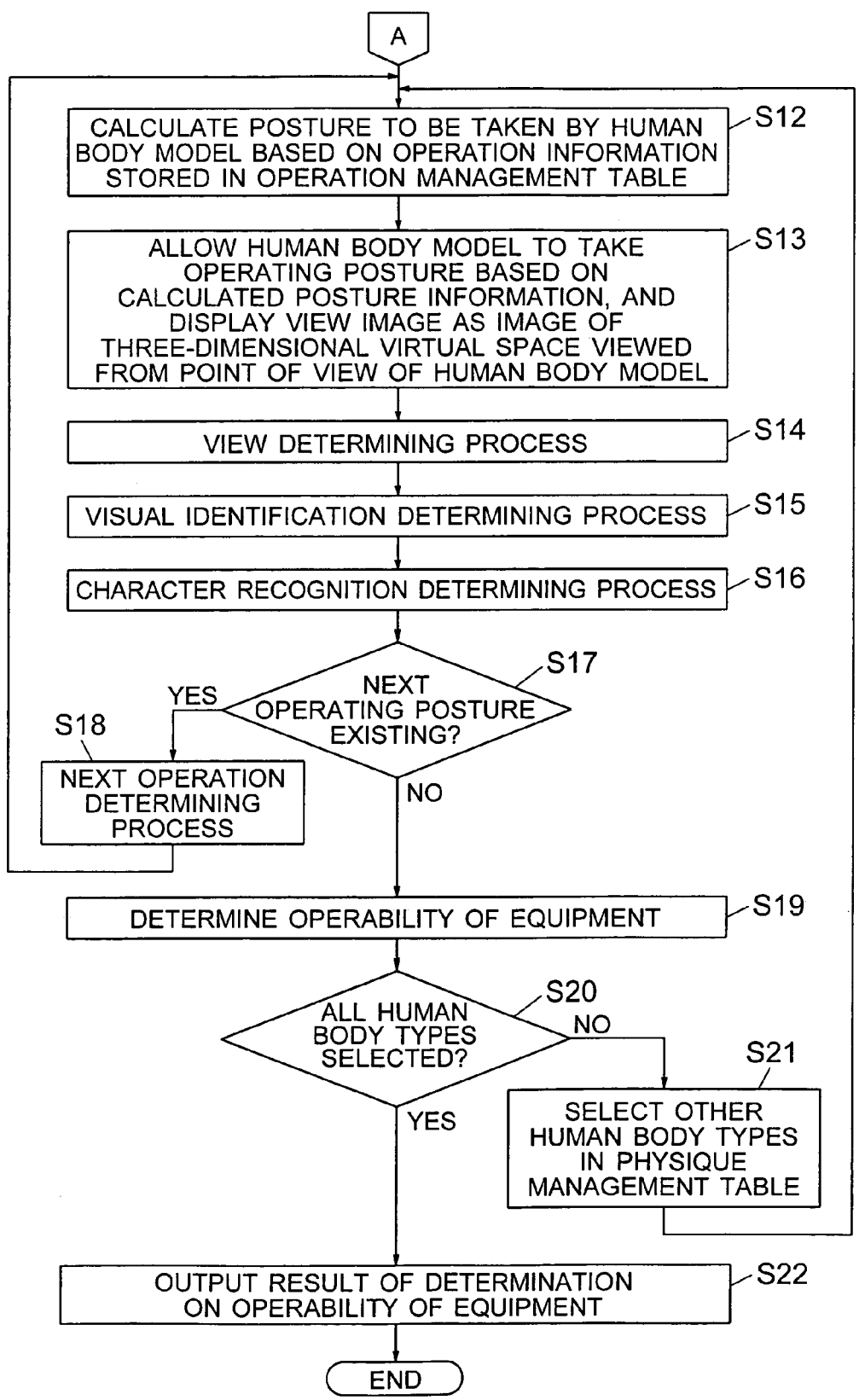

FIGS. 13 and 14 show an example of a flowchart of an equipment operability evaluating process performed by the equipment operability evaluation apparatus 1 according to the present invention, and collectively show the flowchart of the process.

In FIG. 13, the simulation unit 19 calls from the equipment model storage unit 32 an equipment model whose operability is to be evaluated according to the specification input of the user of the equipment operability evaluation apparatus 1 (step S1). For example, the simulation unit 19 calls a model of an ATM.

Then, the simulation unit 19 selects any human body type from the physique management table 23, extracts from the human body model storage unit 31 a human body model corresponding to the physique of the selected human body type, and arranges the extracted human body model together with the equipment model called in the step S1 in the three-dimensional virtual space (step S2).

Next, the target management unit 13 sets a control point and a target position in the target management table 24 according to the specification input of the user (step S3). The target management unit 13 (or the target part management unit 14) checks whether or not there is a target part relating to the set target position (step S4). When there is a target part, the target part management unit 14 sets the target part as associated with the target position in the target part management table 25 according to the specification input of the user (step S5). For example, the name of the target part and the relative position from the target position are set as associated with the target ID in the target part management table 25. When there is no target part relating to the target position, the process in the step S5 is omitted.

Next, the target management unit 13 (or visual identification management unit 15) checks whether or not there is a visual identification target part (step S6). When there is a visual identification target part, the visual identification management unit 15 sets a visual identification target part in the visual identification management table 26 according to the specification input of the user (step S7). Then, the target management unit 13 (or character string setting unit 16) checks whether or not there is (included) a character string on the visual identification target part set in step S7 (step S8). When there is a character string, the character string setting unit 16 sets the attribute of a character string in the character string setting table 27 according to the specification input of the user (step S9). When there is no character string in the visual identification target part, the process in the step S9 is omitted. When there is no visual identification part in the step S6, the processes in the steps S7 to S9 are omitted.

Then, the operation management unit 17 sets the operation information in the operation management table 28 according to the specification input of the user (step S10). For example, the operation management unit 17 sets the order in which the human body model takes the operating posture, the target ID, and (a plurality of) visual identification IDs in the operation management table 28 for each of the operating posture taken by the human body model. Afterwards, the target management unit 13 checks whether or not there is a next operating posture to be taken by the human body model (step S11). When there is a next operating posture, the processes in and after the step S3 are repeated. When there is no subsequent operation (when the operation information has been set for all operating postures), the process in step S12 shown in FIG. 14 is repeated.

In FIG. 14, the posture calculation unit 18 calculates the posture to be taken by the human body model based on the operation information stored in the operation management table 28 (step S12). For example, the target ID of T1 and the visual identification IDs of S1 and S2 are set in the operation management table 28 shown in FIG. 8 corresponding to the operating posture to be firstly taken by the human body model. Furthermore, in the target management table 24 shown in FIG. 4, the control point as the right hand and the target position having the coordinates (100, 200, 1000) are set corresponding to the target ID of T1. Then, for example, the posture calculation unit 18 calculates the posture of the human body model for allowing the right hand of the human body model to move to the coordinates (100, 200, 1000).

Figure 15:
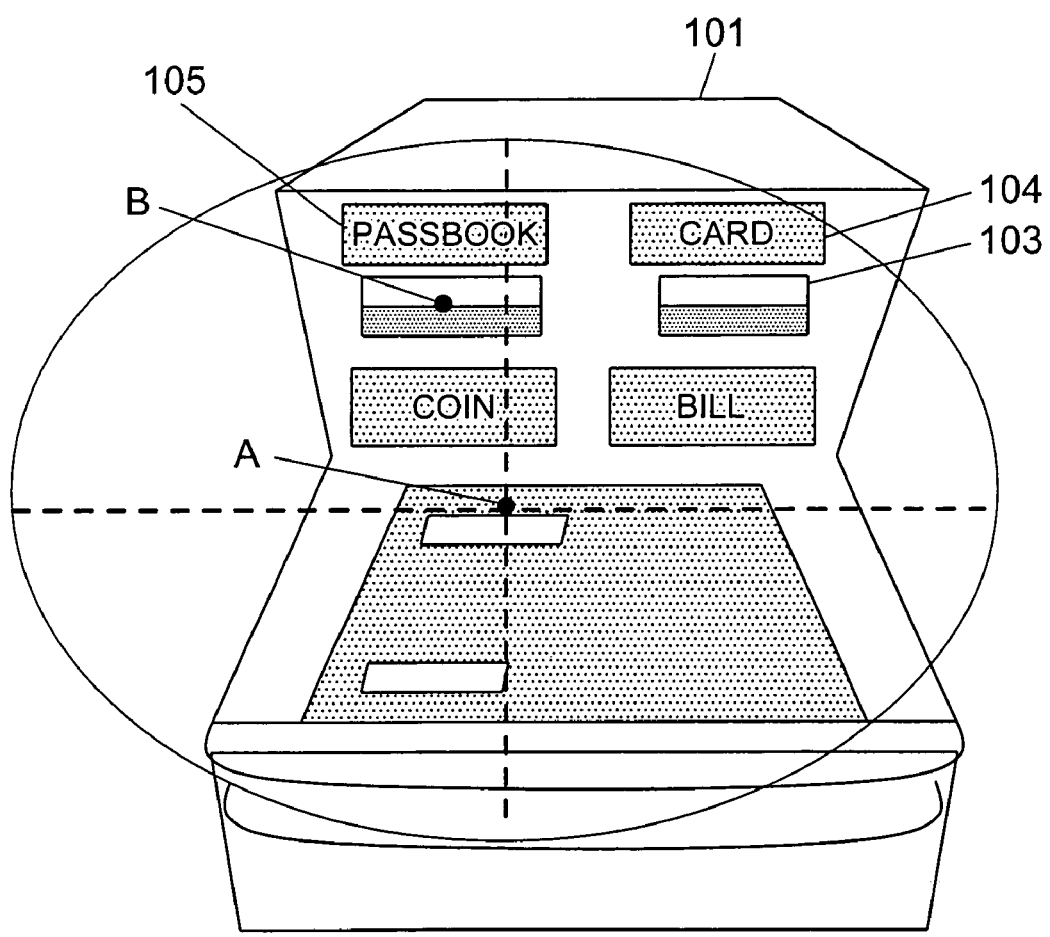
FIG. 15 shows an example of a view image.

Next, the simulation unit 19 allows the human body model to take an operating posture based on the posture information calculated by the posture calculation unit 18, and displays the view image as an image of a three-dimensional virtual space viewed from the point of view of the human body model (step S13). In the process in the step S13, for example, the view image shown in FIG. 15 is displayed. In FIG. 15, the point A is a target position for the current operating posture of the human body model, the point B is the target position for the next operating posture, a flicker 103 and labels 104 and 105 are the visual identification target parts of the equipment model 101 for the current operating posture. In the visual identification management table 26 shown in FIG. 5, the visual identification target part of A. part and C. part are set corresponding to the visual identification ID of S1, and the visual identification target part of B. part is set corresponding to the visual identification ID of S2. Therefore, for example, A. part, B. part, and C. part respectively correspond to the flicker 103, label 104, and label 105 as visual identification target parts as shown in FIG. 15.

Additionally, when the current operating posture is the first operating posture taken by the human body model, then the target ID of T3 corresponding to a second operating posture set in the operation management table 28 shown in FIG. 8 indicates the coordinates of the point B. The oval shown in the view image shown in FIG. 15 is the range of the view of the human body model.

Next, the view determination unit 20 performs the view determining process (step S14). For example, the view determination unit 20 determines whether or not the flicker 103 and the labels 104 and 105 shown in FIG. 15 are in the range of the view of a human body model.

Then, the visual identification determination unit 201 performs the visual identification determining process (step S15). For example, the visual identification determination unit 201 determines in the following process as to whether or not the flicker 103 as the visual identification target part shown in FIG. 15 can be visually identified (easily seen).

Figure 16A:
FIGS. 16A to 16C are explanatory diagrams of the visual identification determining process.
Figure 16B:
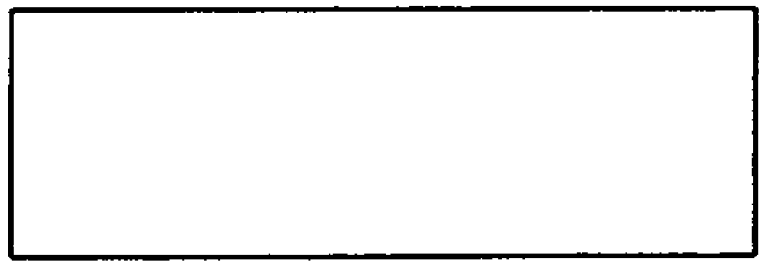
Figure 16C:
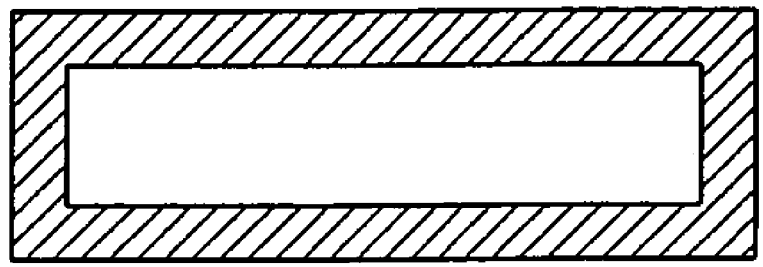

That is, the visual identification determination unit 201 extracts the contour of the flicker 103 from the view image shown in FIG. 15, and generates a banding box as shown in FIG. 16A. Then, the visual identification determination unit 201 generates an enlarged image 1.1 time larger than the banding box shown in FIG. 16A with any point of the flicker 103 in the banding box as the center. FIG. 16B shows the generated enlarged image. The visual identification determination unit 201 superposes the banding box shown in FIG. 16A on the enlarged image shown in FIG. 16B as shown in FIG. 16C. The diagonal portion shown in FIG. 16C is an area in which the enlarged image and the banding box do not overlap each other.

The visual identification determination unit 201 compares, for example, the color (color of the background area of the flicker 103) of the pixel in the view image shown in FIG. 15 for the area of the diagonal portion shown in FIG. 16C with the color (that is, the color of the flicker 103 as a visual identification target part) of the pixel in the enlarged image. Furthermore, the visual identification determination unit 201 compares, for example, the brightness (brightness in the background area) of the pixel in the view image shown in FIG. 15 for the area of the diagonal portion shown in FIG. 16C with the brightness (that is, the brightness of the flicker 103 as a visual identification target part) of the pixel in the enlarged image.

The visual identification determination unit 201 firstly extracts the color of the flicker 103 and the color of the background area, and stores the RGB value of the extracted color of the flicker 103 and the RGB value of the extracted color of the background area respectively in the "visual identification part color RGB" and the "extracted background color RGB" in the visual identification management table 29 shown in FIG. 9. The visual identification determination unit 201 compares the RGB value of the color of the flicker 103 with the RGB value of the color of the background area, sets larger R, G, and B values as maxR, maxG, and maxB, respectively, and smaller R, G, and B values as minR, minG, and minB, respectively, and calculates the color difference X1 by using the following equation.

$$X1 = (\max R - \min R) + (\max G - \min G) + (\max B - \min B)$$

Additionally, the visual identification determination unit 201 defines the value of the difference between the value obtained by the following equation using the RGB value of the extracted color of the flicker 103 and the value obtained by the following equation using the RGB value of the extracted color of the background area as a brightness difference X2.

$$((R \times 299) + (G \times 587) + (B \times 114))/1000$$

For example, the visual identification determination unit 201 determines that a visual identification target part is easily seen when the calculated color difference X1 is equal to or exceeding a predetermined threshold (for example, 500) and the calculated brightness difference X2 is equal to or exceeding a predetermined threshold (for example, 125), and decides that the result of the visual identification determining process is OK (W3C Techniques For Accessibility Evaluation And Repair Tools. Refer to Checkpoint 2.2). The visual identification determination unit 201 decides that the visual identification determining process is NG when the calculated color difference X1 is smaller than the predetermined threshold (for example, 500) or the calculated brightness difference X2 is smaller than the predetermined threshold (for example, 125). The visual identification determination unit 201 can also perform the visual identification determining process on a visual identification target part based on the comparison result between the color difference X1 and the predetermined threshold or the comparison result between the brightness difference X2 and the predetermined threshold.

The visual identification determination unit 201 stores the result of the visual identification determining process in the visual identification management table 29. In the step S15, the visual identification determination unit 201 can also store in the visual identification management table 29 the information indicating whether or not there is a character string on the visual identification target part.

Next, the character recognition determination unit 202 performs a character recognition determining process (step S16). For example, the character recognition determination unit 202 determines in the following process whether or not the character string "card" displayed on the label 104 as a visual identification target part shown in FIG. 15 can be read.

Figure 17A:
FIGS. 17A to 17F are explanatory diagrams of the character recognition determining process.
Figure 17B:
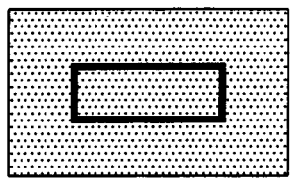

That is, the character recognition determination unit 202 extracts the image of the label 104 on which the character string "card" is displayed as shown in FIG. 17A from the data of the equipment model currently arranged in the three-dimensional virtual space stored in advance in the equipment model storage unit 32. Then, the character recognition determination unit 202 generates a substitute image as a virtual image replacing the image of the character string "card" according to the attribute information about the character string "card" of the label 104 set in the character string setting table 27. The image of the rectangular contour line shown in FIG. 17B is a substitute image. The vertical length of the rectangle forming a replacing image is the length corresponding to the size of the character string "card" set in the character string setting table 27, the longitudinal length of the rectangle is the length corresponding to the length of the character string "card", the width of the contour line of the rectangle corresponds to the width of the character line of the character string "card", and the color of the contour line of the rectangle is the same as the character color of the character string "card". The character recognition determination unit 202 generates an image in which the color of the background of the substitute image is the ground color of the equipment model 101 shown in FIG. 15 as shown in FIG. 17C based on the image shown in FIG. 17B.

Figure 17C:
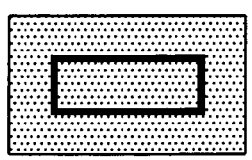
Figure 17D:
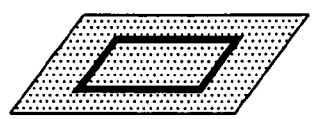
Figure 17E:

Next, the character recognition determination unit 202 generates an image obtained by viewing the image shown in FIG. 17C in the same direction as the line of sight of the human body model seeing the label 104 shown in current FIG. 15 as shown in FIG. 17D in a three-dimensional virtual space. The substitute image shown in FIG. 17D is distorted depending on the direction of the line of sight of the human body model. The character recognition determination unit 202 acquires an image when light is emitted from the light source set in advance to the image shown in FIG. 17D as shown in FIG. 17E. The image is generated by the simulation unit 19. The substitute image shown in FIG. 17E cannot be seen in the right area by the influence of the emitted light.

Figure 17F:
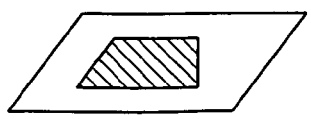

The character recognition determination unit 202 compares the substitute image shown in FIG. 17D with the substitute image shown in FIG. 17E, and calculates the range in which the character string "card" displayed on the label 104 can be read. The range in which the character string "card" can be read is, for example, the shaded area in the image shown in FIG. 17F. When the calculated range in which the character string "card" can be read is equal to or smaller than a predetermined threshold, the character recognition determination unit 202 decides that the result of the character recognition determining process on the character string "card" is NG. When the calculated range in which the character string "card" can be read is larger than the predetermined threshold, the character recognition determination unit 202 decides that the result of the character recognition determining process on the character string "card" is OK.

According to the above-mentioned character recognition determining process, the readability of the character string displayed on the visual identification target part when the visual identification target part of equipment whose operability is to be evaluated is illuminated can be determined. By changing the direction in which light is emitted to the substitute image shown in FIG. 17(D), and performing the character recognition determining process on the character string "card", for example, it can be determined in which direction the light is emitted to the visual identification target part of the equipment with poor readability of the character string displayed on the visual identification target part.

The character recognition determination unit 202 can be configured to determine the readability of the character string "card" based on the actual distance M from the eye of the human body model arranged in the three-dimensional virtual space to the visual identification target part, the actual line width X of the contour of a substitute image, a predetermined eyesight of the human body model, and the direction θ of the line of sight when the human body model sees the visual identification target part.

For example, the character recognition determination unit 202 calculates the distance H from the human body model to the substitute image of the character string "card" when the contour of the substitute image of the line width X×sin θ cannot be seen from the human body model having the eyesight of A. X×sin θ is the line width of the contour of the substitute image seen from the human body model taking an operating posture. For example, the line width corresponds to the line width of the contour of the substitute image shown in FIG. 17D. In calculating the distance H, for example, the principle of the vision test using the Landolt ring. Using the principle of the vision test by the Landolt ring, for example, the distance H is calculated by the equation $H=2(X \times \sin\theta) \times A/(2\pi/360/60)$.

Then, the character recognition determination unit 202 determines that a substitute image cannot be easily seen when the value of the distance M is larger than the value of the distance H, and decides that the result of the character recognition determining process on the label 104 on which character string "card" is displayed is NG. When the value of the distance M is equal to or smaller than the value of the distance H, the character recognition determination unit 202 decides that the result of the character recognition determining process on the label 104 on which the character string "card" is displayed is OK. According to the above-mentioned character recognition determining process, for example, when the result of the character recognition determining process on the label 104 on which the character string "card" is displayed is NG, it is determined that the character string cannot be easily read in the size of the character string "card" set in the character string setting table 27.

That is, according to the above-mentioned character recognition determining process, it can be verified for each operating posture of the human body model whether or not the character string displayed on the visual identification target part of the equipment whose operability is to be evaluated has the size in which the character string can be easily read from the view point of the human model.

Next, the target management unit 13 (or the posture calculation unit 18, or the view determination unit 20) checks whether or not there is the next operating posture to be taken by the human body model (step S17). When there is the next operating posture, the next operation determination unit 203 performs the next operation determining process (step S18), and the processes in and after the step S12 are repeated. In the step S18, the next operation determination unit 203 refers to the operation management table 28, identifies the target ID corresponding to the next operating posture to be taken by the human body model, refers to the target management table 24, and identifies the target position corresponding to the target ID. When the identified target position is in the range of the current view of the human body model, the next operation determination unit 203 decides that the result of the next operation determining process is OK. For example, on the view image shown in FIG. 15, the point B as the next target position is in the current range of the view indicated by an oval. Therefore, it is decided that the result of next operation determining process is OK. According to the next operation determining process in the step S18, it can be verified whether or not the display or the sign for indicating the flow of operation of the equipment is provided on the equipment.

When there is no next operating posture to be taken by the human body model in the step S17, the operation determination unit 21 determines the operability of the equipment in a series of operations performed by the human body model based on the result of the view determining process, the result of the visual identification determining process, the result of the character recognition determining process, and the result of the next operation determining process (step S19). The operation determination unit 21 records on the operation determination table 30 the result of the view determining process, the result of the visual identification determining process, the result of the character recognition determining process, the result of the next operation determining process, and the result of the determination on the operability of the equipment for each operating posture of the human body model.

Afterwards, the target management unit 13 (or the posture calculation unit 18, or the view determination unit 20) checks whether or not there is a human body type not selected from the physique management table 23 (step S20). When there is a human body type not yet selected (the process has not been completed on all human body types), the posture calculation unit 18 selects other human body types in the physique management table 23 (step S21), and the processes in and after the step S12 are repeated. When there is no human body type not yet selected (the process has been completed on all human body types), the output unit 22 outputs the result of the determination on the operability of the equipment (step S22). For example, the output unit 22 outputs the contents of the record in the operation determination table 30.

Figure 18:
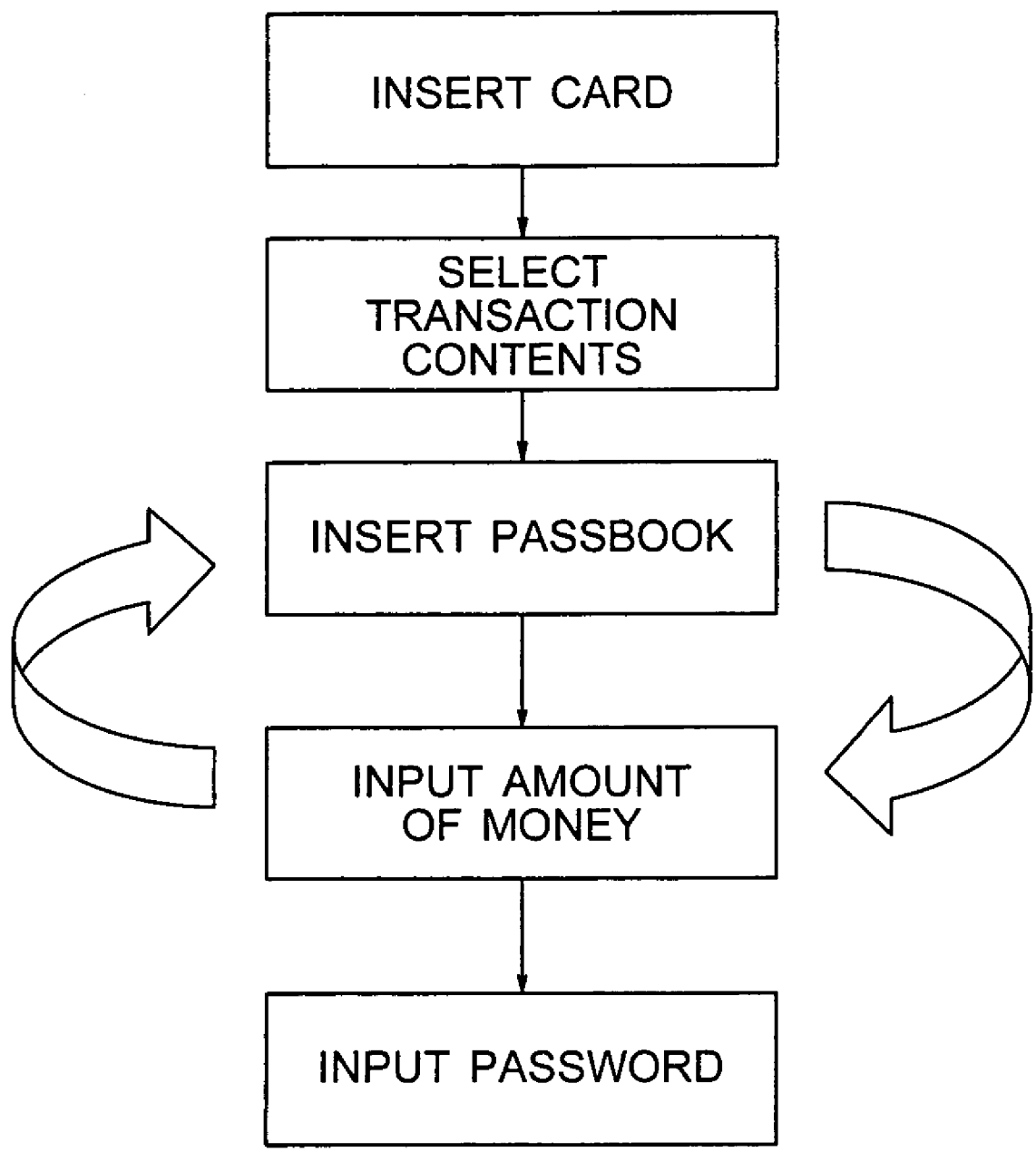
FIG. 18 shows an example of a series of operations performed by a human body model.
Figure 19A:
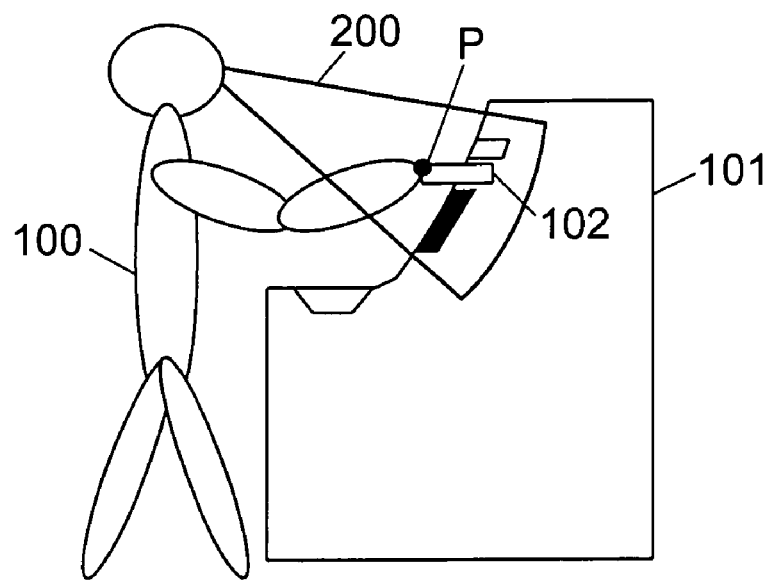
FIGS. 19A and 19B show a human body model and an equipment model arranged in a three-dimensional virtual space.
Figure 19B:
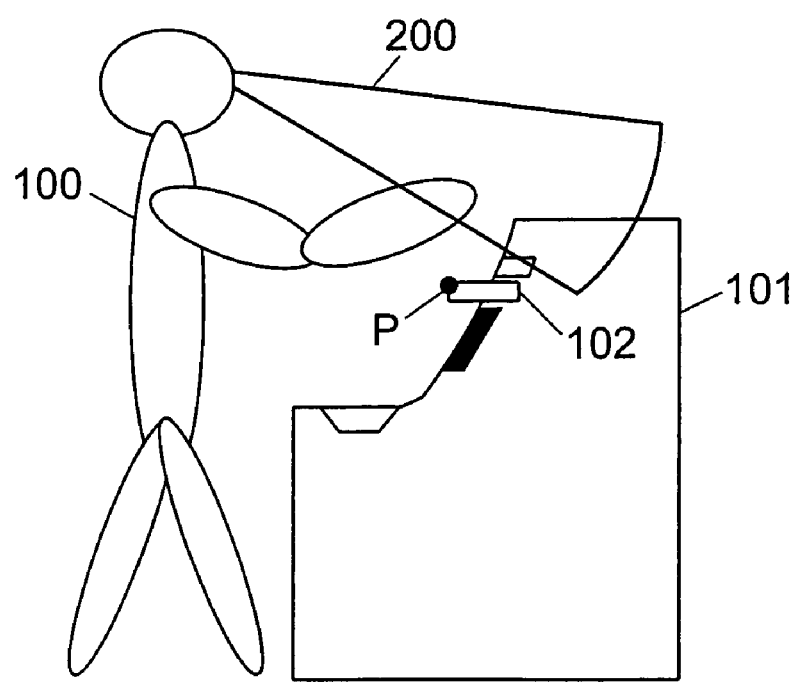
Figure 20A:
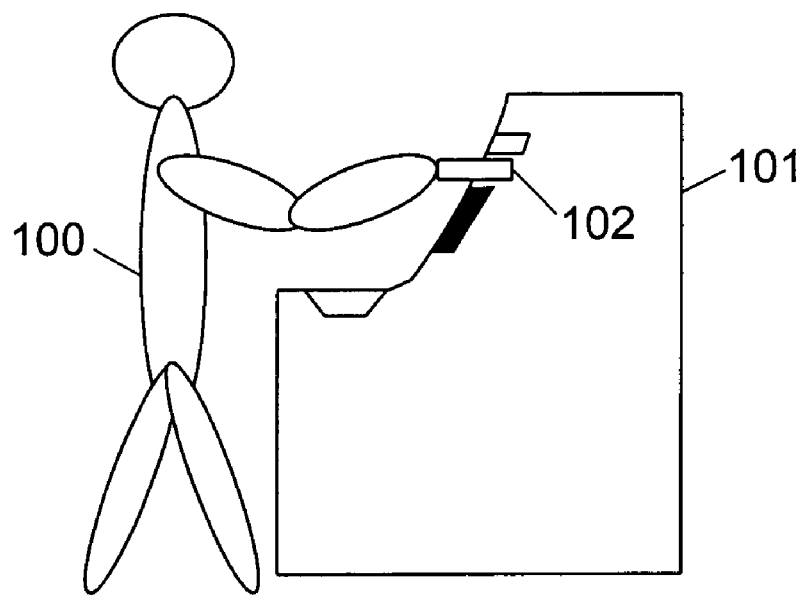
FIGS. 20A and 20B show an example of an operating posture of a human body model.
Figure 20B:
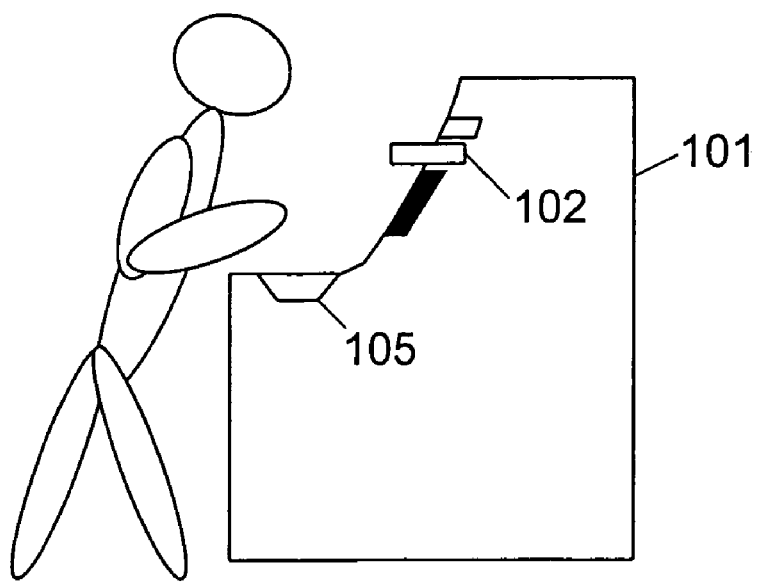

As described above, according to this example, after a human body model is allowed to sequentially take the postures of performing a series of operations by inserting a card, selecting the contents of a transaction, inserting a passbook, inputting the amount of money, and inputting the password shown in FIG. 18, the view determining process, the visual identification determining process, the character recognition determining process, and the next operation determining process can be performed in each operating posture. Particularly, in one embodiment of the present invention, the order in which the operating postures taken by the human body model can be changed only by changing the order in which the human body model takes an operating posture set in the operation management table 28, and the above-mentioned view determining process, the visual identification determining process, the character recognition determining process, and the next operation determining process can be automatically performed for each operating posture taken by the human body model in the changed order.

As described above, according to the apparatus and method for evaluating equipment operability of the present invention, the visibility and the readability can be determined on a visual identification target part of an equipment model viewed from the point of view of a human body model by allowing the human body model to automatically take an operating posture adapted to a target position although the physique of the human body model is changed.

Additionally, according to the apparatus for evaluating equipment operability of the present invention, when the position of a target part is moved, the target position is changed such that a relative position to the predetermined target part can be kept constant when the position of the target part moves. Therefore, although the layout of equipment is changed and the position of the target part is moved, the human body model can be allowed to automatically take an operating posture adapted to the change of the layout of the equipment.

Furthermore, according to the apparatus for evaluating equipment operability of the present invention, the visibility and the readability on a visual identification target part on the equipment model in a series of operations required to attain the purpose of the operation of the equipment can be determined.

What is claimed is:

1. An apparatus for evaluating equipment operability which evaluates operability of equipment, comprising:
 a physique management unit managing physique information about a human body model as a copy of a shape of a human body;
 a target management unit managing a human body part of the human body model and a target position to which the human body part is to be moved as target information;
 a posture calculation unit calculating an operating posture taken when the human body model is operating an equipment model as a copy of a shape of the equipment using the target position as a watch point of the human body model based on the physique information about the human body model managed by the physique management unit and the target information managed by the target management unit;
 a simulation unit arranging the equipment model and the human body model taking the operating posture calculated by the posture calculation unit in a three-dimensional virtual space, and displaying a view image as an image of the three-dimensional virtual space viewed from the point of view of the human body model taking the operating posture;
 a view determination unit determining whether or not a visual identification target part is in the range of the view of the human body model using the information about the visual identification target part as the part of the equipment model to be visually confirmed by the human body model, wherein the view determination unit includes a first determination unit determining visibility of a visual identification target part of the equipment model displayed on the view image and readability of a character string associated with the visual identification target part based on the information about the visual identification target part; and
 a second determination unit determining the operability of the equipment based on a determination result by the first determination unit.

2. The apparatus according to claim 1, wherein the first determination unit performs a visual identification determining process for determining whether or not the visual identification target part can be visually identified based on a difference between a color of the visual identification target part displayed on the view image and a color of a background area of the visual identification target part on the view image, or a difference between brightness of the visual identification target part displayed on the view image and brightness of the background area of the visual identification target part on the view image.

3. The apparatus according to claim 1, further comprising:
 a character string setting unit setting attribute information about a character string associated with the visual identification target part,
 wherein the first determination unit calculates a distance at which the human body model having a predetermined eyesight can visually identified the character string based on the set attribute information about a character string associated with the visual identification target part, information about a direction of a line of sight to the character string of the human body model, and information about the predetermined eyesight of the human body model, and determines readability of the character string based on a comparison result between the calculated distance at which the character string can be visually identified and an actual distance between the human body model and the character string in the three-dimensional virtual space.

4. An apparatus for evaluating equipment operability, comprising:

a physique management unit managing physique information about a human body model as a copy of a shape of a human body;

a target management unit managing a human body part of the human body model and a target position to which the human body part is to be moved as target information;

a posture calculation unit calculating an operating posture taken when the human body model is operating an equipment model as a copy of a shape of the equipment using the target position as a watch point of the human body model based on the physique information about the human body model managed by the physique management unit and the target information managed by the target management unit;

a simulation unit arranging the equipment model and the human body model taking the operating posture calculated by the posture calculation unit in a three-dimensional virtual space, and displaying a view image as an image of the three-dimensional virtual space viewed from the point of view of the human body model taking the operating posture;

a view determination unit determining whether or not a visual identification target part is in the range of the view of the human body model using the information about the visual identification target part as the part of the equipment model to be visually confirmed by the human body model; and a target part management unit managing information about a target part as a part to be operated by the human body model as associated with the target position managed by the target management unit, wherein the target part management unit keeps a relative position of the target part to the target position associated with the target part constant, and wherein the posture calculation unit calculates the operating posture as the posture taken by the human body model operating the equipment model using the target position as a watch point of the human body model based on the physique information about the human body model managed by the physique management unit, target information managed by the target management unit, and information about target part managed by the target part management unit.

5. The apparatus according to claim 4, wherein the posture calculation unit calculates a posture for allowing the human body part managed as the target information about a human body model having a physique corresponding to the physique information about the human body model to move to the target position associated with the target part and for allowing the human body model to visually confirm the visual identification target part.

6. An apparatus for evaluating equipment operability, comprising:

a physique management unit managing physique information about a human body model as a copy of a share of a human body;

a target management unit managing a human body part of the human body model and a target position to which the human body part is to be moved as target information;

a posture calculation unit calculating an operating posture taken when the human body model is operating an equipment model as a copy of a share of the equipment using the target position as a watch point of the human body model based on the physique information about the human body model managed by the physique management unit and the target information managed by the target management unit;

a simulation unit arranging the equipment model and the human body model taking the operating posture calculated by the posture calculation unit in a three-dimensional virtual space, and displaying a view image as an image of the three-dimensional virtual space viewed from the point of view of the human body model taking the operating posture;

a view determination unit determining whether or not a visual identification target part is in the range of the view of the human body model using the information about the visual identification target part as the part of the equipment model to be visually confirmed by the human body model; and an operating posture management unit managing an order in which the human body model takes the operating posture and the target information for use in calculating the operating posture for each operating posture taken by the human body model, wherein the posture calculation unit calculates the operating posture of the human body model in the order in which the human body model takes the operating posture managed by the operating posture management unit.

7. The apparatus according to claim 6, wherein the first determination unit determines whether or not a target position for use in calculating a next operating posture taken by the human body model in a range of view of the human body model for each operating posture taken by the human body model.

* * * * *

UNITED STATES PATENT AND TRADEMARK OFFICE
CERTIFICATE OF CORRECTION

| | | |
|---|---|---|
| PATENT NO. | : 7,533,001 B2 | Page 1 of 1 |
| APPLICATION NO. | : 11/510655 | |
| DATED | : May 12, 2009 | |
| INVENTOR(S) | : Koji Demizu et al. | |

It is certified that error appears in the above-identified patent and that said Letters Patent is hereby corrected as shown below:

Column 24, Line 9, change "share" to --shape--.

Column 24, Line 16, change "share" to --shape--.

Signed and Sealed this

Fourth Day of August, 2009

JOHN DOLL
*Acting Director of the United States Patent and Trademark Office*